(12) United States Patent
Sim et al.

(10) Patent No.: US 7,960,023 B2
(45) Date of Patent: Jun. 14, 2011

(54) ADHESIVE FILM FOR STACKING SEMICONDUCTOR CHIPS

(75) Inventors: Chang-Hoon Sim, Seoul (KR); Ki-Jeong Moon, Seoul (KR); Hae-Sang Jun, Seoul (KR); Jun-Ho Lee, Uijeongbu-si (KR); Yun-Min Park, Seoul (KR)

(73) Assignee: Toray Advanced Materials Korea Inc., Gumi-Si (KR)

( * ) Notice: Subject to any disclaimer, the term of this patent is extended or adjusted under 35 U.S.C. 154(b) by 798 days.

(21) Appl. No.: 11/950,470

(22) Filed: Dec. 5, 2007

(65) Prior Publication Data

US 2008/0226884 A1 Sep. 18, 2008

(30) Foreign Application Priority Data

Mar. 13, 2007 (KR) .................. 10-2007-0024620

(51) Int. Cl.
*B32B 7/12* (2006.01)
*B32B 7/00* (2006.01)

(52) U.S. Cl. .............. 428/354; 428/343; 428/355 R; 428/355 EP

(58) Field of Classification Search .................. None
See application file for complete search history.

(56) References Cited

U.S. PATENT DOCUMENTS

| | | | | |
|---|---|---|---|---|
| 5,683,806 A * | 11/1997 | Sakumoto et al. | ............. | 428/343 |
| 6,048,576 A * | 4/2000 | Hwail et al. | ................... | 427/208 |
| 6,328,844 B1 * | 12/2001 | Watanabe et al. | ............. | 156/330 |
| 6,621,170 B2 * | 9/2003 | Yamamoto et al. | ........... | 257/783 |
| 6,777,464 B1 * | 8/2004 | Watanabe et al. | ............. | 523/457 |
| 2003/0102466 A1 * | 6/2003 | Kumakura et al. | ............ | 252/511 |
| 2003/0190466 A1 * | 10/2003 | Nakaba et al. | ................ | 428/344 |
| 2006/0089465 A1 * | 4/2006 | Kim et al. | ...................... | 525/486 |
| 2007/0126129 A1 * | 6/2007 | Ahn et al. | ...................... | 257/783 |
| 2009/0011166 A1 * | 1/2009 | Kim et al. | ..................... | 428/41.8 |
| 2009/0294046 A1 * | 12/2009 | Sim et al. | .................. | 156/272.4 |

FOREIGN PATENT DOCUMENTS

| | | |
|---|---|---|
| EP | 1970422 A2 * | 9/2008 |
| JP | S60-196956 | 10/1985 |
| JP | S60-223139 | 11/1985 |
| JP | S62-040183 | 2/1987 |
| KR | 10-2000-0048223 | 7/2000 |
| KR | 10-2002-0075426 | 10/2002 |
| KR | 10-2003-0038147 | 5/2003 |
| KR | 10-2006-0045432 | 5/2006 |
| KR | 10-0593314 | 6/2006 |
| WO | WO 95/20820 | 8/1995 |

OTHER PUBLICATIONS

Sim, Chang-Hoon et al. "Adhesive Film for Semiconductor Chip Lamintion", abstract of JP 2008-227455A, published on Sep. 25, 2008.*

* cited by examiner

*Primary Examiner* — Alicia Chevalier
*Assistant Examiner* — Anish Desai
(74) *Attorney, Agent, or Firm* — Harness, Dickey & Pierce, P.L.C.; Anthony G. Fussner; Kisuk Lee

(57) ABSTRACT

There is provided an adhesive film for stacking semiconductor layers of chips comprising: a first adhesive layer comprising phenoxy resin, epoxy resin and phenol resin; a second adhesive layer comprising phenoxy resin and an ultraviolet ray curable compound; and a third adhesive layer comprising phenoxy resin, epoxy resin and phenol resin, wherein the second adhesive layer is disposed between the first adhesive layer and the third adhesive layer.

15 Claims, 3 Drawing Sheets

ADHESIVE FILM FOR STACKING SEMICONDUCTOR CHIPS

RELATED APPLICATIONS

The present application is based on, and claims priority from, Republic of Korea Application Number 10-2007-0024620, filed Mar. 13, 2007, the disclosure of which is hereby incorporated by reference herein in its entirety.

BACKGROUND OF THE INVENTION

1. Technical field

The invention relates to an adhesive film for stacking semiconductor chips, and more particularly to an adhesive film for stacking semiconductor chips that enables at least 3 layers of chips having the same area to be stacked without using any separate spacers that are sandwiched between upper and lower chips in order to keep a wire spacing between the upper and lower chips in stacking semiconductor silicone chips, and that can retain adhesiveness in a repeated stacking process subject to high temperature thus to ensure reliability of semiconductors.

2. Description of the Prior Art

In general, in order to enhance integration of semiconductors, a method is widely used, of stacking several layers of silicone chips by efficiently using spacers in a semiconductor package. In order to efficiently employ this stacking method, wafer backside lamination (WBL) is employed in which an adhesive film is first stacked on one side of a wafer to dice it. Subsequently chips are picked up to bond them at a time. With the aforementioned technology, it is possible to enhance integration of semiconductors by a factor of twice to four times, when stacking one layer on and below a lead frame, respectively, in a double die package (DDP) which is a package for lead frames, but two layers, respectively, in the case of quad die package (QDP). In a chip size package (CSP) employing solder balls for electric connections, a method is applied, of stacking 3 layers of chips on a substrate with the solder balls in order to enhance integration.

In order to employ the aforementioned chip stacking technology in a semiconductor package, an adhesive film that can bond chips should essentially be used. The chip stacking film is provided on a dicing tape to be laminated on a silicone wafer and then diced, in order to be used while being picked up, wherein the chip stacking film is generally referred to a dicing die attach film (DDAF) or a dicing chip attach film (DCAF).

The aforementioned adhesive film is based on a thermosetting epoxy resin which is mixed with a hardener and thermoplastic and high-molecular weight acrylic elastomers, acrylonitrile butadiene rubber (NBR), and modified acrylonitrile rubber (CTBN, ATBN) as a binder resin. The published KP No. 10-2002-0075426 discloses an adhesive film comprising an epoxy resin composition and high molecular weight acrylic elastomers. The published KP No. 10-2006-0045432 discloses an adhesive film comprising an epoxy resin composition and modified acrylonitrile butadiene rubber, and the registered KP No. 10-0593314 discloses an adhesive film comprising an epoxy resin composition and acrylonitrile butadiene rubber.

In the meantime, in stacking chips with the aforementioned chip stacking films, a separate spacer must be sandwiched between upper and lower chips in order to keep a given spacing between upper and lower wires in the process of stacking chips to have the same area in each layer. As shown in FIG. 1a, a lower chip is first attached on a substrate or a lead frame. Wires are then attached around the chip. Right after that, as shown in FIG. 1b, a rectangular spacer is fixed, in the center of the chip not to interfere with the wires. As shown in FIG. 1c, an upper chip with an adhesive film is then stacked on the spacer by applying a given pressure and high temperature to complete the chip stacking process in two layers. The spacer used in this case is a highly heat-resistant film of a high elastic modulus, e.g., a polyimide (PI) film or silicone film. The film used can be of one-side or double-side adhesive type. However, for stacking the spacer, a separate process and cost is accordingly required. Also, adhesiveness between interfaces may be significantly lowered because of a difference in coefficients of thermal expansion and elastic moduli between the stacked spacer and the adhesive film of epoxy resin thereon. As a result, delamination may occur to lower reliability of semiconductors. Also, after stacking chips at a high temperature of 150° C., the package should be subject to a wire attach process at 190 to 210° C., essential for a semiconductor production process. If three or more layers of chips are stacked, repeated thermal stress is given to the package, so that more stress is given to the interface between the spacer and the adhesive film to lead to critical effect on semiconductor reliability.

Also, in a conventional adhesive film, thermoplastic rubber is used as a binder resin for achieving cohesion in an epoxy resin composition. However, the rubber binder resin is not well compatible with the epoxy resin composition, so that micro phase separation occurs, leading to thermal degradation of the rubber binder in the chip stacking process subject to a repeated stacking process at high temperature and thereby to lower adhesiveness, which is not desired.

In a case that a spacer is not used and the thickness of an adhesive film is made greater than the height of wires, the wires of a lower chip naturally pass through the adhesive film of an upper chip to interfere with the upper chip or thereby to cause damages and deformation of wires while bond line thickness (BLT) is significantly lowered and it is thus impossible to stack chips in layers. If the stacked area is made different in the upper chip layer and the lower chip layer, e.g., making the wire area in the upper chip layer smaller than the area of the lower chip layer for stacking the chips, the aforementioned problems are addressed, but the stacked chips are structured a pyramid, so that it is impossible to implement the same integration and such a stacking scheme may be used only for at most two layers. Therefore, stacking of at least three layers having the same area cannot substantially be implemented.

Therefore, with prior technologies using both of spacers and adhesive films, it is impossible to stack chips in 3 or more layers. In particular, for an advanced semiconductor package, such as a multi chip package (MCP), in which several chips, e.g., DRAM, SRAM, flash memories are stacked in one package, it is required to stack 8 or more layers of chips to have the same area in each layer, in order to make the package function properly. It is thus needed to improve the prior art chip stacking technology and the adhesive film.

BRIEF SUMMARY OF THE INVENTION

The invention was devised to address the prior art technical problem as described above. It is an object of the invention to provide an adhesive film for stacking semiconductor chips in layers, with which it is not required to use separate spacers and a process of stacking the spacers in stacking the chips one another, and it is possible to stack chips in 3 or more layers without interference with upper and lower wires in stacking the chips. One more important thing is reliability of semiconductors is not lowered in a repeated wire stacking process subject to high temperature because of high adhesiveness among chips.

The aforementioned and other object and advantages of the invention will be more apparent from the following description stating preferred embodiments of the invention, with reference to the accompanying drawings.

An adhesive film for stacking semiconductor chips according to the invention to achieve the aforementioned objects is characterized in that it comprises (a) a first adhesive layer comprising phenoxy resin, epoxy resin and phenol resin, (b) a second adhesive layer comprising phenoxy resin and ultraviolet ray curable small molecule compounds, and being stacked on the first adhesive layer, and (c) a third adhesive layer comprising phenoxy resin, epoxy resin and phenol resin, being stacked on the second adhesive layer.

Preferably, the adhesive film according to the invention is characterized in that the first adhesive layer is 1 to 30 μm thick, the second adhesive layer is 5 to 50 μm thick, and the third adhesive layer is 30 to 80 μm thick.

Also, preferably, the adhesive film according to the invention is characterized in that the phenoxy resin in the first, the second and the third adhesive layers has the following chemical formula:

Chemical formula 2

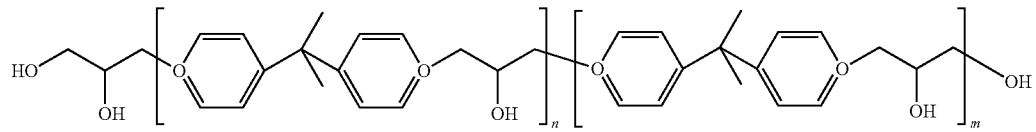

where n ranges 1 to 50, and m ranges 1 to 100.

Also, preferably, the adhesive film according to the invention is characterized in that the ultraviolet ray curable small molecule compounds can enhance the elastic modulus of the phenoxy resin in the second adhesive layer by means of UV curing, and is an epoxy acrylate compound.

Also, preferably, the adhesive film according to the invention is characterized in that the phenoxy resin has a dynamic storage modulus by UV curing of at least 20 MPa at 260° C.

More preferably, the adhesive film according to the invention is characterized in that the first adhesive layer and the third adhesive layer comprises 10 to 70 parts by weight of the phenol resin on the basis of 100 parts by weight of the epoxy resin, 10 to 200 parts by weight of the phenoxy resin on the basis of 100 parts by weight of a total amount of the epoxy resin and the phenol resin, and the second adhesive layer comprises 1 to 50 parts by weight of the ultraviolet ray curable small molecule compounds on the basis of 100 parts by weight of the phenoxy resin.

BRIEF DESCRIPTION OF THE DRAWINGS

The features and advantages of the present invention will become apparent from the following detailed description of preferred embodiments thereof illustrated with reference to the accompanying drawings, in which.

DETAILED DESCRIPTION OF THE PREFERRED EMBODIMENT

Hereinafter, the invention will be described in detail with reference to the embodiments and drawings of the invention. It will be apparent to those skilled in the art that those embodiments are intended to illustrate the invention in more detail, not to limit the scope of the invention.

Figure 1A:
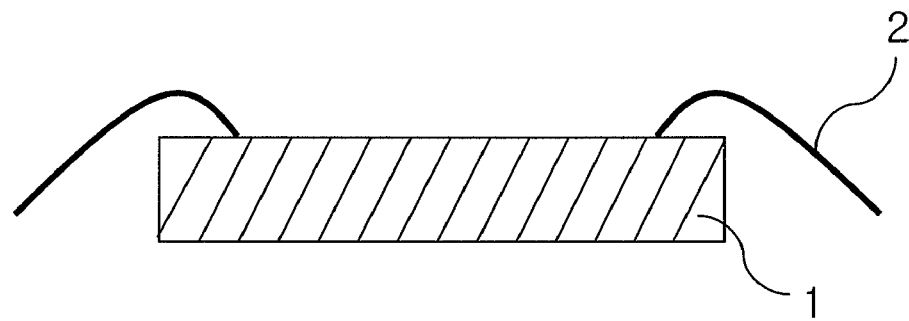
FIGS. 1a to 1c illustrate an embodiment of a chip stacking process in which a conventional spacer is used.
Figure 1B:
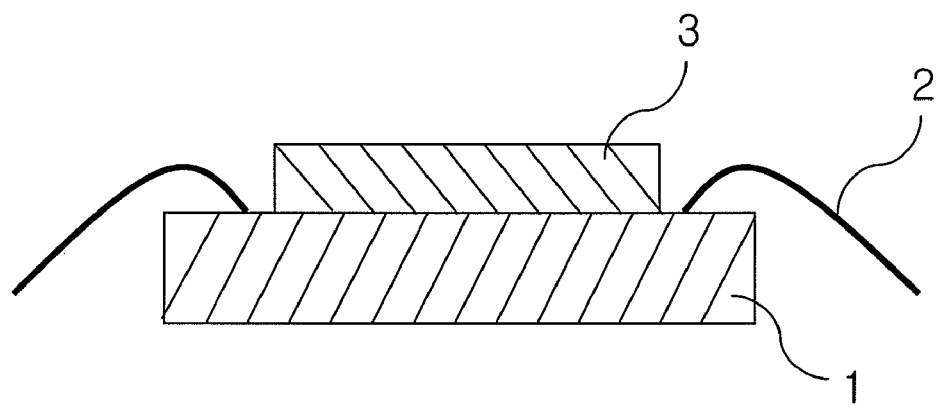
Figure 1C:
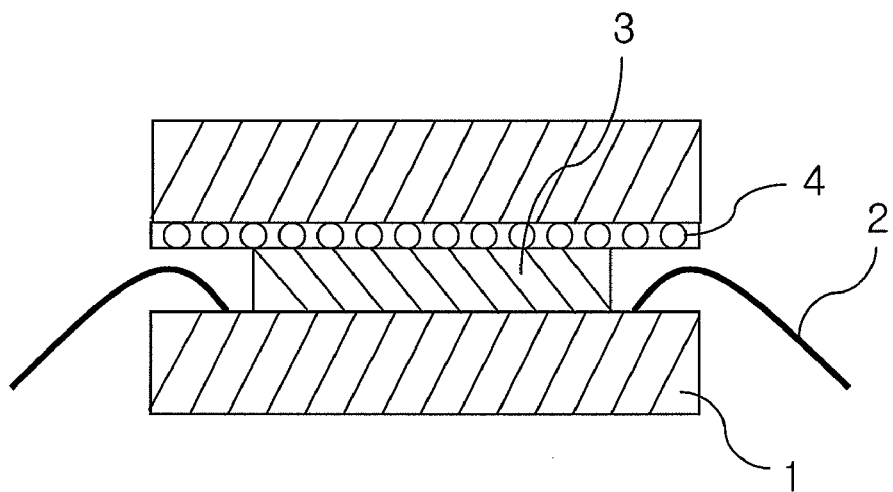
Figure 2A:
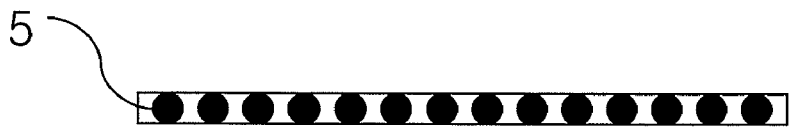
FIGS. 2a to 2d illustrate a process of producing an adhesive film for stacking semiconductor chips according to the invention.
Figure 2B:
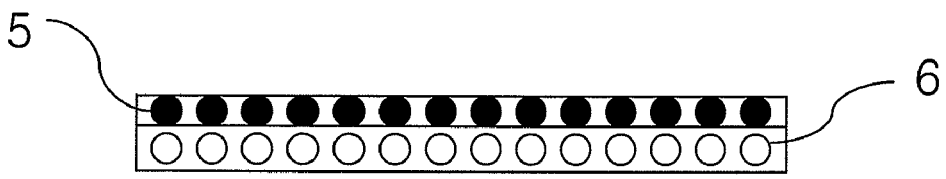
Figure 2C:
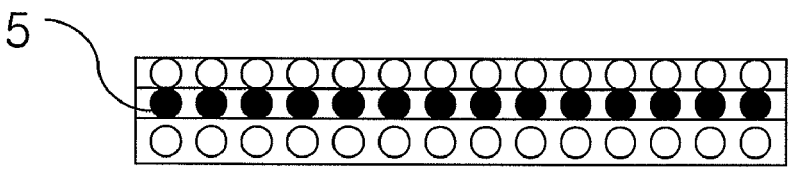
Figure 2D:
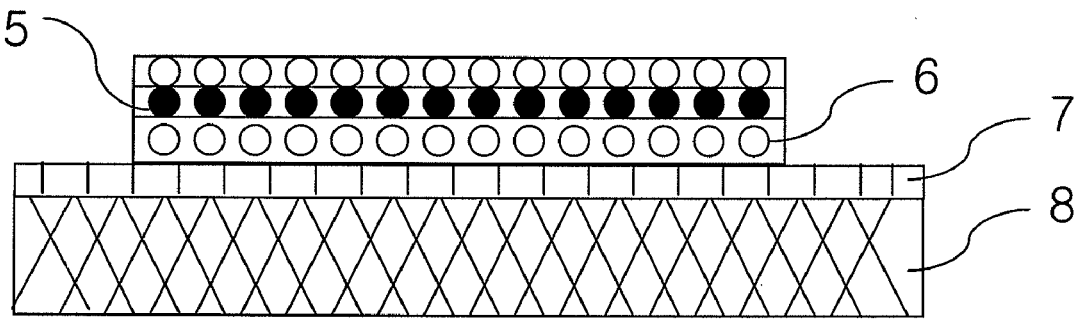

As shown in FIG. 2c, the adhesive film for stacking semiconductor chips according to the invention comprises: a first thermosetting adhesive layer; a second thermoplastic and ultraviolet ray (UV) curable adhesive layer of phenoxy resin stacked on the first adhesive layer; and a third thermosetting adhesive layer stacked on the second adhesive layer of phenoxy resin. Here, a total thickness of the first adhesive layer, the second adhesive layer of phenoxy resin and the third adhesive layer is not greater than 160 μm. The adhesive film according to the invention is characterized in that the first adhesive layer is 1 to 30 μm thick, the second adhesive layer of phenoxy resin is 5 to 50 μm thick and the third adhesive layer is 30 to 80 μm thick. The adhesive film according to the invention may comprise a release film as a protective film or may be produced to be bonded on a dicing tape as shown in FIG. 2d.

Now, the action according to the configuration of the invention will be described in more detail. The first thermosetting adhesive layer and the third adhesive layer comprise epoxy resin and a hardener, and also thermoplastic phenoxy resin well compatible with the epoxy resin. In a conventional adhesive film, thermoplastic rubber is used as a binder resin in order to achieve cohesion in the epoxy resin composition as described above. However, the rubber binder resin is not well compatible with the epoxy resin composition, so that micro phase separation occurs. It then results in lowered adhesiveness due to thermal degradation of the rubber binder in the process of stacking chips with a repeated stacking process subject to high temperature. Therefore, in the invention, by containing the thermoplastic phenoxy resin as a binder resin, well compatible with the epoxy resin and the hardener, micro phase separation can be avoided while inducing improved interface adhesiveness by means of inter-diffusion on the interface with the second adhesive layer of phenoxy resin to produce a solid adhesive layer.

Next, the second adhesive layer is based on thermoplastic phenoxy resin and comprises UV curable small molecule compounds. As described above, by forming a gradient layer on the interfaces between the first and the third adhesive layer and the second adhesive layer by means of diffusion of phenoxy resin molecules, entanglement occurs in each adhesive layer by means of inter-diffusion among phenoxy resin molecules to lead to strong coupling and a behavior as one adhesive layer and to be safe from external stress.

Figure 2E:
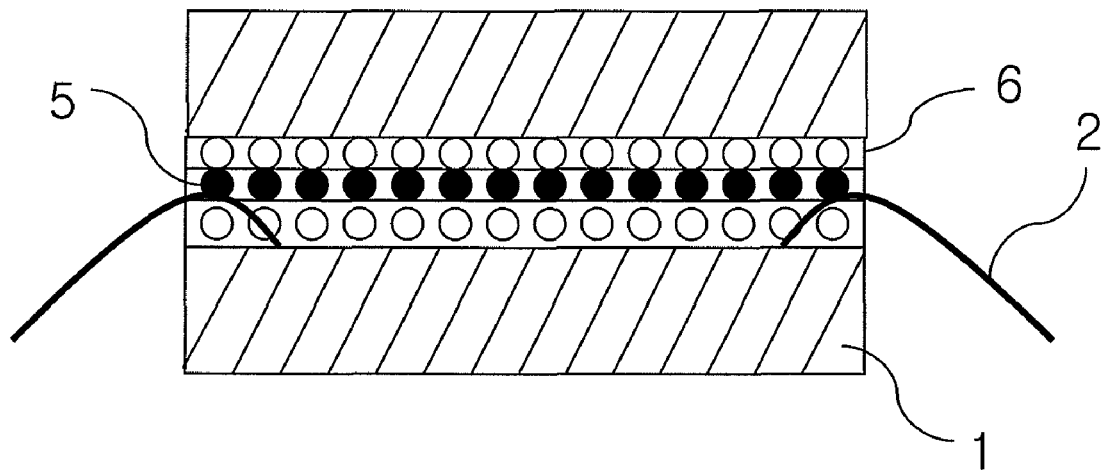
FIG. 2e illustrates an embodiment of a process of stacking chips with an adhesive film for stacking semiconductor chips according to the invention.

Next, when ultraviolet rays are illuminated on the adhesive film produced as such according to the invention, the UV curable small molecule compounds contained in the second adhesive layer of phenoxy resin solidly coupled between the first and the third epoxy resin adhesive layers cure the adhesive layer of phenoxy resin, so that it is possible to directly form a film of a high elastic modulus in an adhesive film. Since the film of a high elastic modulus by means of UV curing is formed inside, a structure of an adhesive film is obtained, as shown in FIG. 2e, which avoids damages by upper chips interfering with the wires of lower chips or by the wires of the lower chips going far into the adhesive film to cause damages in the upper chips, in stacking the chips.

Figure 3:
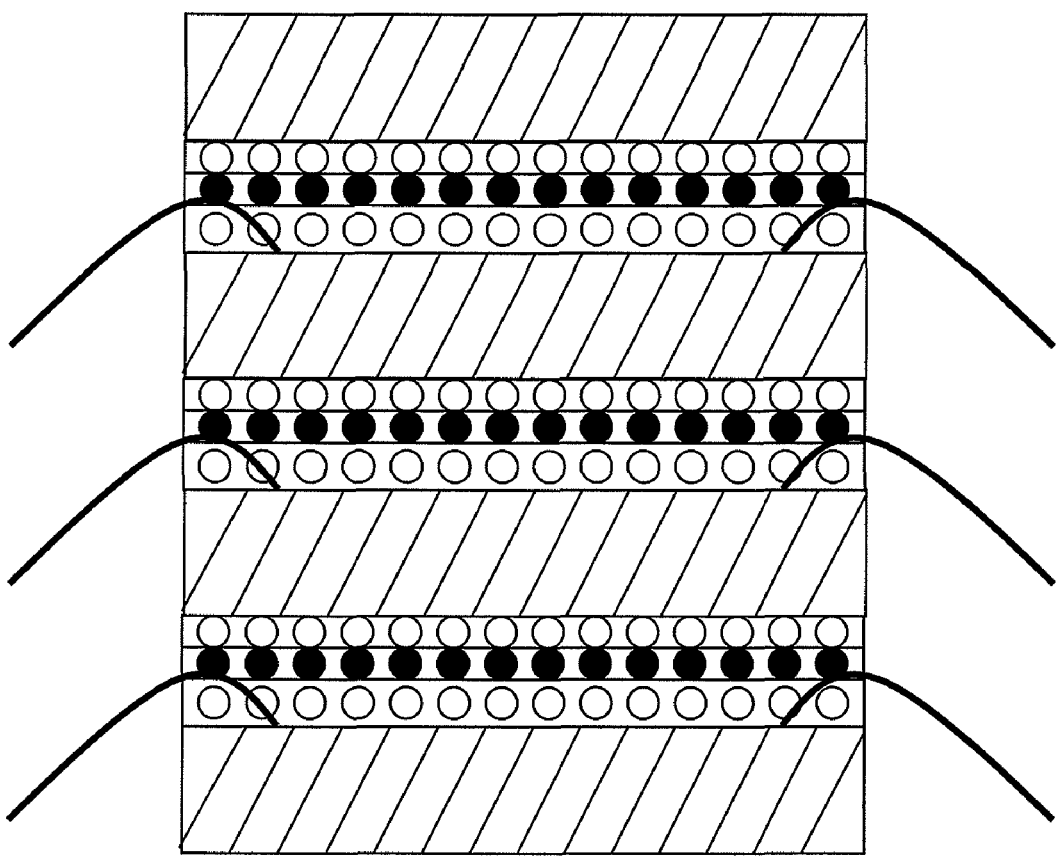
FIG. 3 illustrates an embodiment of stacking chips through a chip stacking process with an adhesive film for stacking semiconductor chips according to the invention.

More important action in the above configuration is to directly form and comprise a phenoxy resin film being elastic and heat resistant by means of UV curing inside. Therefore, when a plurality of chips are stacked in layers as shown in FIG. 3a, high durability is obtained in a resulting package produced by the chip and wire stacking process repeatedly subject to high temperature and reliability of semiconductors is thus not deteriorated.

As compared to the case of forming an adhesive layer on both sides of a separate highly elastic and heat-resistant film similar to a conventional spacer in the above configuration, the separate heat-resistant film is not well compatible with the adhesive layer of epoxy resin on the interface and interaction among molecules is not enough, so that the resultant film is not strong as desired and adhesiveness may be likely to be lowered in a repeated stacking process subject to high temperature because of each different elastic modulus and a difference in thermal expansion coefficients.

In the invention, without using a separate heat-resistant film of a high elastic modulus, the aforementioned problems are addressed by a diffusion gradient to enable a film for replacing a conventional spacer to be formed in an adhesive film of epoxy resin and by directly forming the film by means of UV curing.

The inventive method of the invention is applicable to all cases of stacking semiconductor chips in layers for which highly reliable adhesive films must be used. In particular, in a case of comprising a multi-layer structure for use of the adhesive films, interfacial adhesiveness between adhesive layers tends to affect reliability of a final semiconductor package in many cases. Therefore, to overcome the effect, different type of surface processing or formulation is applied. However, with inter-diffusion by compatibility between adhesive layers proposed in the invention, there is formed a gradient area among molecules, that is, an interphase layer on the interface of adhesive layers. Two adhesive layers are solidly coupled at an unseparable level. In this state, if only a desired adhesive layer is cured by means of a different curing method, desired physical properties can be selectively given to an intended adhesive layer although the adhesive layers have each different physical properties.

In the aforementioned method of forming an interphase layer film by inducing compatibility between adhesive layers, the scheme of inducing a gradient only by means of a difference in molecular weight and the same chemical structure for a main component in a first and a second adhesive layers is easily contemplated. However, it is not easy to devise a scheme of stacking two adhesive layers through a method of inducing inter-molecule diffusion on an interface between the adhesive layers having each different thermal behavior and then curing only an intermediate layer for stacking the two adhesive layers. For example, in the case that, as in the invention, a first adhesive layer is of thermosetting resin, a second adhesive layer is of thermoplastic resin and a third adhesive layer is of thermosetting resin, diffusion among molecules is not easily achieved since the thermosetting resin is of a crosslinking structure having branches and the thermoplastic resin is of a linear chain structure. It is hard to form a solid gradient layer on an interface because of insufficient compatibility although diffusion is achieved over a long period of time. To settle such a problem in the invention, a method is proposed of stacking an adhesive layer of thermosetting resin and another adhesive layer of thermoplastic resin by means of compatibilization technology. In the invention, it was attempted to use phenoxy resin in an adhesive layer of epoxy resin to enhance compatibility with epoxy resin while keeping high adhesiveness between the adhesive layers by making a second adhesive layer of phenoxy resin. It was also attempted to form a solid film by means of UV curing in order for the adhesive layer of phenoxy resin to keep a wire spacing between an upper chip and a lower chip in the process of stacking chips in layers.

With the adhesive film for stacking chips according to the invention produced as described above, it was possible to stack chips without the problem of interference with wires although a conventional spacer was not used in the process of stacking layers of chips to have the same area. More particularly, it was possible to stack 3 or more layers of chips. In particular, adhesiveness was not lowered in the chip stacking process and wire stacking process, repeatedly subject to high temperature, and it was also possible to keep reliability of semiconductor packages.

Hereinafter, various embodiments of an adhesive film for stacking chips in layers according to the invention will be described with a method of producing the film.

In the aforementioned configuration, the first adhesive layer and the third adhesive layer comprise a thermosetting composition. The composition is not limited to a specific type, provided that molecules therein can be diffused by means of heat and it also exhibits adhesiveness by means of thermosetting. In particular, epoxy resin is used because of its high adhesiveness and humidity resistance, and phenol resin may be used as a hardener for curing the epoxy resin. The composition may comprise a binder resin of a low elastic modulus in order to minimize stress occurring in a process of dicing wafers for cutting them into chips and in order to reduce brittleness by increasing cohesion of adhesive films.

The epoxy resin should have two or more functional groups, and may be epoxy resin having 100 to 1000 weight per equivalent epoxy (WPE), e.g., cresol novolac resin, solid phase bisphenol A type, liquid bisphenol A type, bisphenol F, rubber-modified epoxy, etc. In particular, the novolac epoxy resin is preferred in terms of heat resistance.

The softening point of the epoxy resin is preferably not higher than 100° C., and more preferably not higher than 80° C., to enable diffusion of molecules by means of heat. The molecular weight of the epoxy resin is preferably 2,000 to 8,000, and more preferably 3,000 to 5,000.

The hardener for curing the epoxy resin is not limited to a specific type, provided that it can cure epoxy resin. In case of curing novolac epoxy resin, it is preferred specially to use novolac type phenol resin. In order to facilitate curing of the epoxy resin, a curing facilitating agent may be used, e.g., imidasol compounds, amines, etc.

The softening point of the hardener is preferably not higher than 100° C., more preferably not higher than 80° C., in order to enable diffusion of molecules by means of heat with the epoxy resin. The molecular weight of the hardener is preferably 2,000 to 8,000, and more preferably 3,000 to 5,000.

The amount of the phenol resin used as a hardener is generally 10 to 70 parts by weight, and preferably 30 to 50 parts by weight, on the basis of 100 parts by weight of the epoxy resin. Furthermore, the amount of the curing facilitating agent used to facilitate curing of the epoxy resin is generally 0.01 to 10 parts by weight, and preferably 1 to 3 parts by weight on the basis of 100 parts by a total amount of the epoxy resin and the hardener. If 10 or more parts by weight of the curing facilitating agent are used, curing of the epoxy resin is facilitated too much in the process of forming an adhesive layer, so that the resultant film may be brittle and adhesiveness may also not be achieved. If the amount thereof is not more than 0.01 part by weight, the curing process is slow and additional curing time is required.

The thermosetting composition comprises thermoplastic phenoxy resin as a binder resin in order to induce inter-molecule diffusion by means of compatibility and thus to prevent micro phase separation. While the phenoxy resin is a thermoplastic resin, it is well compatible with the epoxy resin in their chemical structure, so that molecular entanglement easily occurs by means of inter-diffusion. This is a reason why the thermoplastic phenoxy resin is used in the invention, and its chemical structure is shown in the following chemical formula 1.

Proper phenoxy resins in the adhesive film for stacking semiconductor chips according to the invention have a structure of the following general chemical formula 1:

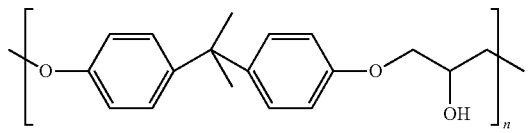

<Chemical formula 1> where n ranges 1 to 50.

More preferably, resins having a structure of the following chemical formula 2 may be used.

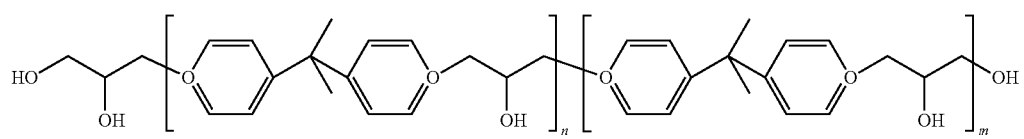

<Chemical formula 2> where n ranges 1 to 50 and m ranges 1 to 100.

The amount of the phenoxy resin in the composition for forming the first and the third adhesive layers is 10 to 200 parts by weight, and preferably 30 to 100 parts by weight, on the basis of 100 parts by weight of a total amount of the epoxy resin and the phenol resin. If the amount of phenoxy resin is 200 or more parts by weight, the speed of curing epoxy resin is slow. If the amount of the phenoxy resin is not more than 10 parts by weight, cohesion in the adhesive layer of epoxy resin is not sufficient disadvantageously to lead to brittleness of the layer.

The glass transition of temperature (Tg) of the phenoxy resin is not higher than 100° C. in order to induce diffusion by means of heat and the molecular weight of the phenoxy resin lies between 5,000 and 75,000.

Next, the second adhesive layer of an inter-layer diffusion gradient is based on the thermoplastic phenoxy resin and comprises UV curable small molecule compounds.

The UV curable small molecule compounds are not limited to a specific type, provided that they can be cured by ultra-violet rays. The UV curable small molecule compounds have at least one double bond in a molecule, e.g., the small molecule compounds disclosed in the published JP No. 60(1985)-196956 and No. 60(1985)-223139. Examples of the compounds include acrylic compounds, e.g., trimethylol propane triacrylate, tetra methylol methane tetra acrylate, penta erythritol triacrylate, and epoxy acrylate.

The amount of the UV curable small molecule compounds is generally 1 to 50 parts by weight, and preferably 5 to 15 parts by weight on the basis of 100 parts by weight of the phenoxy resin. More preferably, epoxy acrylate is used which is well compatible with the phenoxy resin. Using the epoxy acrylate enables a crosslinking curing structure to be formed by means of UV illumination. In particular, since the curing structure is formed in a gradient layer formed by diffusion with the adhesive layer of thermosetting epoxy resin, a solid adhesive interface is thereby obtained and it is possible to produce phenoxy resin into a film of a high elastic modulus at a time.

Furthermore, in order to initiate curing of the UV curable small molecule compounds, a photoinitiator may be used, e.g., benzo phenone, aceto phenone, dibenzyl, diacetyl, diphenyl sulfide, azobisisobutyronitrile, etc. The amount of the aforementioned photoinitiator is generally 0.5 to 10 parts by weight, and preferably 1 to 5 parts by weight, on the basis of 100 parts by weight of the UV curable small molecule compounds.

In the invention, in order to obtain wire fixing effect in the adhesive layer of phenoxy resin, a filler in addition to UV curing may be further added if required. Examples of the filler used in the invention include organic and inorganic fillers, but inorganic fillers are preferred in order to enhance incombustibility and thermal conductivity.

Examples of the inorganic filler include magnesium hydroxide, amorphous silica, crystalline silica, boron nitride, etc. An example of the organic filler include a rubber filler, e.g., a acrylonitrile butadiene rubber filler, silicone rubber filler, methacrylate butadiene styrene copolymer, etc.

In the invention, with the aforementioned components as described above, respective adhesive layers are formed and inter-molecule diffusion is derived on interfaces between the adhesive layers, respectively, by means of heat, to form a gradient. The phenoxy adhesive layer is then cured by applying UV rays. It is thus possible to produce a solid adhesive film of a three-layer structure. In stacking chips with the adhesive film according to the invention, wires of a lower chip are embedded to a certain depth of the adhesive film of an upper chip while wires are fixed naturally at a certain height because of a cured film of phenoxy of a high elastic modulus formed in the adhesive film, the upper and lower layers of chips having the same area. Therefore, the adhesive film according to the invention can function well like a conventional spacer. In the repeated stacking process subject to high temperature for stacking chips, the inter-layer interface in the adhesive film is firmly held, so that reliability of semiconductors is ensured without lowered adhesiveness between stacked chips.

Hereinafter, the invention will be described in more detail with reference to the embodiments of the invention. In the following description, the term 'part by weight' applies for representing the weight of solid components. It should be noted that the invention is not limited thereto.

Embodiment

Sample 1: Producing a First and a Third Adhesive Layer of Epoxy Resin

First, agitated was a mixture of 100 parts by weight of the cresol novolac epoxy resin (YDCN 8P, commercially available from Toto Kasei Co.), 50 parts by weight of the phenol novolac resin (KPH2000, commercially available from Kolon Chemical Co.), 0.02 parts by weight of 1-cyano ethyl-2-phenyl imidasol(CURE SOL 2PZ-CN, commercially available from Shikoku Kasei Co.) in a solvent of methyl ethyl ketone for 3 hours. Subsequently, 50 parts by weight of the phenoxy resin (YP50, commercially available from Toto Kasei Co.) was added to the agitated mixture, the mixture being then agitated for 6 hours again. The resulting agitated mixture was applied on a substrate of release-treated polyterephthalate film 38 μm thick. The coated film was then dried at 90° C. for 3 minutes to produce a first adhesive layer at B stage which was 40 μm thick and to produce a third adhesive layer at B stage which was 10 μm thick.

Sample 2: Producing a Second Adhesive Layer of Phenoxy Resin

First, 100 parts by weight of the phenoxy resin (YP50, commercially available from Toto Kasei Co.) was mixed with a solvent of methyl ethyl ketone. Subsequently, the mixture was mixed again with 20 parts by weight of the epoxy acrylate and one part by weight of the aceto phenone and the resulting mixture was agitated for 30 minutes. The resulting agitated mixture was applied on a substrate of release-treated polyterephthalate film 38 μm thick. The coated film was then dried at 90° C. for 3 minutes to produce an adhesive layer which was 30 μm thick.

Sample 3: Producing an Adhesive Film Comprising the First Adhesive Layer of Epoxy Resin First, a first adhesive layer 40 μm thick at B stage was produced which was the same as for the above sample 1. Another adhesive layer 30 μm thick was produced on the first adhesive layer, this adhesive layer being the same as for the sample 2. A third adhesive layer 10 μm thick at B stage was produced which was the same as for the sample 1. A cast polypropylene film was stacked to protect the adhesive layers.

Comparative Example

Comparative Sample 1: Producing an Adhesive Film Comprising a Spacer

The comparative sample was produced which was the same as for the sample 3, except that a spacer was used instead of the sample 2. Here, the spacer was of a polyimide film (50 μm, Upilex S, Tg of 500° C.) and produced the same as for the sample 3.

Comparative Sample 2: Producing an Adhesive Film Consisting of a Single Layer

For comparison, adhesive films were produced which was 40 μm thick, respectively, with the same components and mixing ratios for the first and the third adhesive layers, the sample 2 not being included. The two layers were bonded to be a single layer 80 μm thick. Then the same process as for the sample 3 was applied.

Experimental Result 1: Measuring Inter-Layer Adhesiveness of the Adhesive Film

In order to check adhesiveness depending on compatibility between the adhesive layer of epoxy resin and the adhesive layer of phenoxy resin produced as described above, the sample 1 and the sample 2 were cut to be 150 mm in length and 50 mm in width, respectively, and then bonded at a pressure of 0.2 MPa at a room temperature. Subsequently, adhesiveness was checked depending on curing conditions and the following table 1 shows the results. UV illumination intensity was 200 mJ/cm².

TABLE 1

| Curing condition/ Adhesiveness (g_f/50 mm) | Epoxy adhesive layer (sample 1)/ Phenoxy adhesive layer (sample 2) | Epoxy adhesive layer (sample 1)/ Polyimide film (Upilex-S) (Comparison) |
|---|---|---|
| 30° C., 10 min. | 3 | 2 |
| 30° C., 30 min. | 70 | 2 |
| 50° C., 10 min. | 250 | 3 |
| 50° C., 30 min. | 980 | 3 |
| 90° C., 10 min. | Impossible to measure (destroyed cohesion) | 60 |
| 90° C., 30 min. | Impossible to measure (destroyed cohesion) | 75 |
| 150° C., 30 min. | Impossible to measure (destroyed cohesion) | 160 |
| 30° C., UV illumination after 30 min. | Impossible to measure (destroyed cohesion) | — |

As seen in the above table 1, it was shown that adhesiveness of the sample 1 and the sample 2 increased over time from a room temperature. Accordingly, it was also observed that interfacial adhesiveness increased by means of inter-diffusion of phenoxy molecules between the adhesive layer of epoxy resin and the adhesive layer of phenoxy resin. In particular, it was observed that, by means of UV illumination, the adhesiveness level greatly increased by means of curing of the UV curable small molecule compounds located on an interface. Here, "impossible to measure" means that cohesion destruction was observed in measuring adhesiveness between layers. This means that inter-diffusion among molecules occurred on an interface between layers, so that the interfacial adhesiveness became as great as the layers were unseparable.

Experimental Result 2: Measuring an Elastic Modulus of the Adhesive Layer of Phenoxy Resin The storage modulus of the samples 1, 2 and 3 was measured, respectively, with an instrument for measuring dynamic viscoelastic properties (AR2000, commercially available from TA Co.). Each sample was cut to be 20 mm in length and 4 mm in width. The storage modulus of the samples 1 and 3 was measured in a tension mode at a temperature of 170° C. after curing for one hour and that of the sample 2 was measured in a tension mode under the condition of a heat rising speed of 5° C./min and 10 Hz after UV illumination. The results are shown in the following table 2. The UV illumination intensity was 200 mJ/cm².

TABLE 2

| Temp. for measurement/ Storage modulus (MPa) | Sample 1 (epoxy adhesive layer) | Sample 2 (phenoxy adhesive layer) | Sample 3 (Adhesive film) | Phenoxy resin (Comparison) |
|---|---|---|---|---|
| 25° C. | 380 | 420 | 480 | 420 |
| 150° C. | 30 | 28 | 35 | 5 |
| 260° C. | 18 | 20 | 25 | 3 |

As seen from the above table 2, it was shown that the elastic modulus of the thermoplastic phenoxy resin increased through curing of UV curable small molecule compounds. As compared to the case of phenoxy resin not containing UV curable small molecule compounds, the case of sample 2 showed that its elastic modulus increased by a factor of 5 times at high temperature. In case of the adhesive film of the sample 3 including the sample 2, it is seen that the elastic modulus of the sample 3 increased at high temperature more because of interfacial adhesiveness. Therefore, it is seen that it is possible to provide an adhesive film in which wires of a lower chip can be supported at 150° C. for stacking chips and adhesiveness between chips is kept in a process of stacking chips subject to high temperature for stacking chips in layers repeatedly, by introducing an adhesive layer of phenoxy resin and applying UV curing to the layer.

Experimental Result 3: Performance of Stacking Semiconductor Chips

First, the sample 3, the comparative sample 1 and the comparative sample 2 were stacked on a dicing tape (Adwill G-64, commercially available from Lintec Corp.) at a pressure of 0.2 MPa, respectively. Subsequently, they were laminated on a wafer of 70 μm (thickness)×8 inches (diameter) at 60° C., respectively. They were cut to be a chip size of 16 mm×10 mm, respectively, and then picked up to make a stack of 4 layers. Their interfacial state and wire state were observed with a scanning acoustic tomography (SAT). The results are shown in the following table 3.

Saw speed: 120 mm/sec
Rpm: 40,000
Saw depth: 50 μm
Stacking condition: The samples were placed for 30 minutes at 200° C. after stacking them at 150° C.×3 sec×0.5 MPa, respectively.

TABLE 3

| Evaluation | Sample 3 | Comparative sample 1 | Comparative sample 2 |
|---|---|---|---|
| Saw line burr | Good | Good | Poor |
| Chip deformation (between upper and lower chips) | Good | Good | Good |
| Wire deformation | Good | Good | Wire deformation |
| Inter-chip peeling | Good | Inter-chip peeling | — |

The results in the above table 3 show the performance of the adhesive films in the process of stacking chips in multiple layers. In case of the comparative sample 1, the interfacial adhesiveness between the spacer and the adhesive film in a repeated stacking process subject to high temperature was lowered to cause inter-chip peeling. In case of the comparative sample 2, wire deformation occurred because no spacer was included. The sample 3 showed a good result in stacking performance. As a result, it is seen that reliability of semiconductors is ensured by enhancing durability of adhesive films thanks to the presence of an adhesive layer of phenoxy resin, and it is also possible to stack chips in multiple layers without any separate spacers in the process of stacking chips in layers.

Experimental Result 4: Evaluating PCT Resistance and Cracking Resistance

First, samples were produced with the same method used for the samples produced in the aforementioned experimental result 3, in order to evaluate PCT resistance and cracking resistance. For the PCT resistance, the samples were observed for peeling on a stacking interface between chips 24 hours after producing the film at 121° C., 2 MPa and a relative humidity of 100%. For evaluating cracking resistance, the samples were made to pass through, three times, an IR Reflow set to be kept for 30 seconds at 260° C. pursuant to JEDEC spec. J-STD-020A, in order to observe peeling through the SAT.

The absorptance shown in the following table 4 was measured by measuring weight fractions after testing PCT resistance. The conditions, for the samples were a relative humidity of 100% and 121° C. for 24 hours under heating and being pressurized at 2 MPa.

TABLE 4

| Evaluation | Sample 3 | Comparative sample 1 | Comparative sample 2 |
|---|---|---|---|
| Absorptance (%) | 1.2 | 3.8 | 1.2 |
| PCT resistance | Good | Good | Good |
| Reflow resistance | Good | Peeling | Good |

The results shown in the above table 4 represent durability of adhesive films affecting reliability of semiconductors after stacking the chips at high temperature. In the comparative sample 1, adhesiveness between the spacer and the adhesive film was lowered to cause much absorption on the interface to lead to poor reflow resistance. The sample 3 and the comparative sample 2 kept adhesiveness by introducing an adhesive layer of phenoxy resin without using a spacer to lead to good reflow resistance.

As described above, with the adhesive film for stacking semiconductor chips according to the invention, it is possible to stack chips in 3 or more layers in the same area without using a conventional spacer, by inducing molecular diffusion by compatibility of epoxy resin and phenoxy resin between adhesive layers in an adhesive film and by means of UV curing to form a strong adhesive layer. With the film of the invention, it is advantageous that reliability of semiconductors is ensured by keeping adhesiveness, in a repeated process of stacking chips subject to high temperature.

It should be noted that the above mentioned embodiments are intended to illustrate rather than limit the invention, and that those skilled in the art will be capable of designing many alternative embodiments without departing from the scope of the invention as defined by the appended claims. In the claims, use of he word "comprising", and its conjugates, does not exclude the presence of elements other than those listed in any claims or the specification as a whole. The singular reference of elements does not exclude the plural reference of such elements and vice-versa.

DESCRIPTION FOR REFERENCE NUMERALS IN DRAWINGS 1. silicone chip
2. wire
3. spacer
4 conventional chip stacking film
5. second thermoplastic adhesive layer of phenoxy resin 6. first and third thermosetting adhesive layer of epoxy resin
7. adhesive layer on a dicing tape
8. substrate for a dicing tape

The invention claimed is:

1. An adhesive film comprising:
   (a) a first adhesive layer consisting of phenoxy resin, epoxy resin and phenol resin;
   (b) a second adhesive layer comprising phenoxy resin and an ultraviolet (UV) ray curable small molecule compound; and
   (c) a third adhesive layer consisting of phenoxy resin, epoxy resin and phenol resin,
     wherein the second adhesive layer is disposed between the first adhesive layer and the third adhesive layer, and
     wherein the adhesive film is cured by UV ray.

2. The adhesive film as claimed in claim 1, wherein the first adhesive layer is 1 to 30 μm thick, the second adhesive layer is 5 to 50 μm thick, and the third adhesive layer is 30 to 80 μm thick.

3. The adhesive film as claimed in claim 1, wherein the phenoxy resin of the first, the second and the third adhesive layers has the following chemical formula 2:

Chemical formula 2

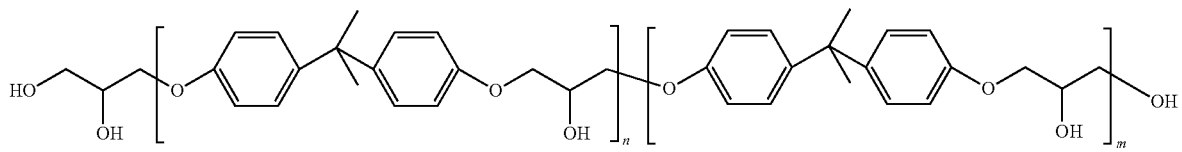

where n ranges 1 to 50, and m ranges 1 to 100.

4. The adhesive film as claimed in claim 1, wherein the UV ray curable compound is epoxy acrylate.

5. The adhesive film as claimed in claim 1, wherein the phenoxy resin has a dynamic storage modulus of at least 20 MPa at 260° C.

6. The adhesive film as claimed in claim 1, wherein each of the first adhesive layer and the third adhesive layer consists of 10 to 70 parts by weight of the phenol resin on the basis of 100 parts by weight of the epoxy resin, 10 to 200 parts by weight of the phenoxy resin on the basis of 100 parts by weight of a total amount of the epoxy resin and the phenol resin, and
   wherein the second adhesive layer comprises 1 to 50 parts by weight of the UV ray curable compound on the basis of 100 parts by weight of the phenoxy resin.

7. The adhesive film as claimed in claim 2, wherein each of the first adhesive layer and the third adhesive layer consists of 10 to 70 parts by weight of the phenol resin on the basis of 100 parts by weight of the epoxy resin, 10 to 200 parts by weight of the phenoxy resin on the basis of 100 parts by weight of a total amount of the epoxy resin and the phenol resin, and
   wherein the second adhesive layer comprises 1 to 50 parts by weight of the UV ray curable compound on the basis of 100 parts by weight of the phenoxy resin.

8. The adhesive film as claimed in claim 3, wherein each of the first adhesive layer and the third adhesive layer consists of 10 to 70 parts by weight of the phenol resin on the basis of 100 parts by weight of the epoxy resin, 10 to 200 parts by weight of the phenoxy resin on the basis of 100 parts by weight of a total amount of the epoxy resin and the phenol resin, and
   wherein the second adhesive layer comprises 1 to 50 parts by weight of the UV ray curable compound on the basis of 100 parts by weight of the phenoxy resin.

9. The adhesive film as claimed in claim 4, wherein each of the first adhesive layer and the third adhesive layer consists of 10 to 70 parts by weight of the phenol resin on the basis of 100 parts by weight of the epoxy resin, 10 to 200 parts by weight of the phenoxy resin on the basis of 100 parts by weight of a total amount of the epoxy resin and the phenol resin, and
   wherein the second adhesive layer comprises 1 to 50 parts by weight of the UV ray curable compound on the basis of 100 parts by weight of the phenoxy resin.

10. The adhesive film as claimed in claim 5, wherein each of the first adhesive layer and the third adhesive layer consists of 10 to 70 parts by weight of the phenol resin on the basis of 100 parts by weight of the epoxy resin, 10 to 200 parts by weight of the phenoxy resin on the basis of 100 parts by weight of a total amount of the epoxy resin and the phenol resin, and
   wherein the second adhesive layer comprises 1 to 50 parts by weight of the UV ray curable compound on the basis of 100 parts by weight of the phenoxy resin.

11. The adhesive film as claimed in claim 1, wherein the second adhesive layer further comprises a photoinitiator.

12. The adhesive film as claimed in claim 11, wherein the photoinitiator is selected from benzo phenone, aceto phenone, dibenzyl, diacetyl, diphenyl sulfide, and azobisisobutyronitrile.

13. The adhesive film as claimed in claim 1, wherein the second adhesive layer further comprises a filler.

14. The adhesive film as claimed in claim 13, wherein the filler is selected from magnesium hydroxide, amorphous silica, crystalline silica, boron nitride, acrylonitrile butadiene rubber filler, silicone rubber filler, and methacrylate butadiene styrene copolymer.

15. The adhesive film as claimed in claim 1, wherein the adhesive film comprises:
   the first layer having a thickness of 1 to 30 μm consisting of 10 to 70 parts by weight of the phenol resin on the basis of 100 parts by weight of the epoxy resin, 10 to 200 parts by weight of the phenoxy resin on the basis of 100 parts by weight of a total amount of the epoxy resin and the phenol resin;
   the second layer having a thickness of 5 to 50 μm consisting of 1 to 50 parts by weight of the UV ray curable compound and 100 parts by weight of the phenoxy resin; and
   the third layer having a thickness of 30 to 80 μm consisting of 10 to 70 parts by weight of the phenol resin on the basis of 100 parts by weight of the epoxy resin, 10 to 200 parts by weight of the phenoxy resin on the basis of 100 parts by weight of a total amount of the epoxy resin and the phenol resin.

* * * * *